United States Patent
Nguyen et al.

(10) Patent No.: US 7,874,065 B2
(45) Date of Patent: Jan. 25, 2011

(54) PROCESS FOR MAKING A MULTILAYER CIRCUIT BOARD

(76) Inventors: Vinh T. Nguyen, 1647 Arbor Grove Dr., San Jose, CA (US) 95131; Claude A. S. Hamrick, 95 S. Market St., Suite 570, San Jose, CA (US) 95113

( * ) Notice: Subject to any disclaimer, the term of this patent is extended or adjusted under 35 U.S.C. 154(b) by 61 days.

(21) Appl. No.: 12/263,416

(22) Filed: Oct. 31, 2008

(65) Prior Publication Data

US 2009/0158581 A1    Jun. 25, 2009

Related U.S. Application Data

(60) Provisional application No. 61/001,156, filed on Oct. 31, 2007, provisional application No. 60/989,361, filed on Nov. 20, 2007.

(51) Int. Cl.
*H05K 3/36* (2006.01)

(52) U.S. Cl. .............. 29/830; 29/840; 29/846; 29/852; 427/97.1; 427/97.2

(58) Field of Classification Search ......... 29/830, 29/840, 846, 852; 427/87.1, 97.2
See application file for complete search history.

(56) References Cited

U.S. PATENT DOCUMENTS

| | | | | |
|---|---|---|---|---|
| 4,915,983 | A * | 4/1990 | Lake et al. | 430/314 |
| 5,129,142 | A * | 7/1992 | Bindra et al. | 29/852 |
| 5,232,548 | A * | 8/1993 | Ehrenberg et al. | 216/18 |
| 5,876,842 | A * | 3/1999 | Duffy et al. | 428/209 |
| 6,388,204 | B1 * | 5/2002 | Lauffer et al. | 174/261 |
| 6,617,526 | B2 * | 9/2003 | Miller | 174/261 |
| 6,720,502 | B1 * | 4/2004 | Alcoe et al. | 174/262 |
| 7,592,703 | B2 * | 9/2009 | Kripesh et al. | 257/773 |
| 7,605,075 | B2 * | 10/2009 | Okabe et al. | 438/637 |

* cited by examiner

*Primary Examiner*—C. J Arbes
(74) *Attorney, Agent, or Firm*—IPxLaw Group LLP; Claude A. S. Hamrick

(57) ABSTRACT

A process for making a multi-layered circuit board having electrical current traces includes providing a substrate having a $1^{st}$ layer of conductive material to form a ground plane, plurality of metallic $1^{st}$ traces on a $2^{nd}$ side of the substrate having widths of approximately 25 microns or less, developing $1^{st}$ ribs of photoresist forming $1^{st}$ walls rising above upper surface of an adjacent seed layer trace, depositing $1^{st}$ conductive signal traces having a thickness exceeding 25 microns into channels and over seed layer traces and stripping the ribs to leave $1^{st}$ conductive traces having a height-to-transverse ratio exceeding 1.

12 Claims, 10 Drawing Sheets

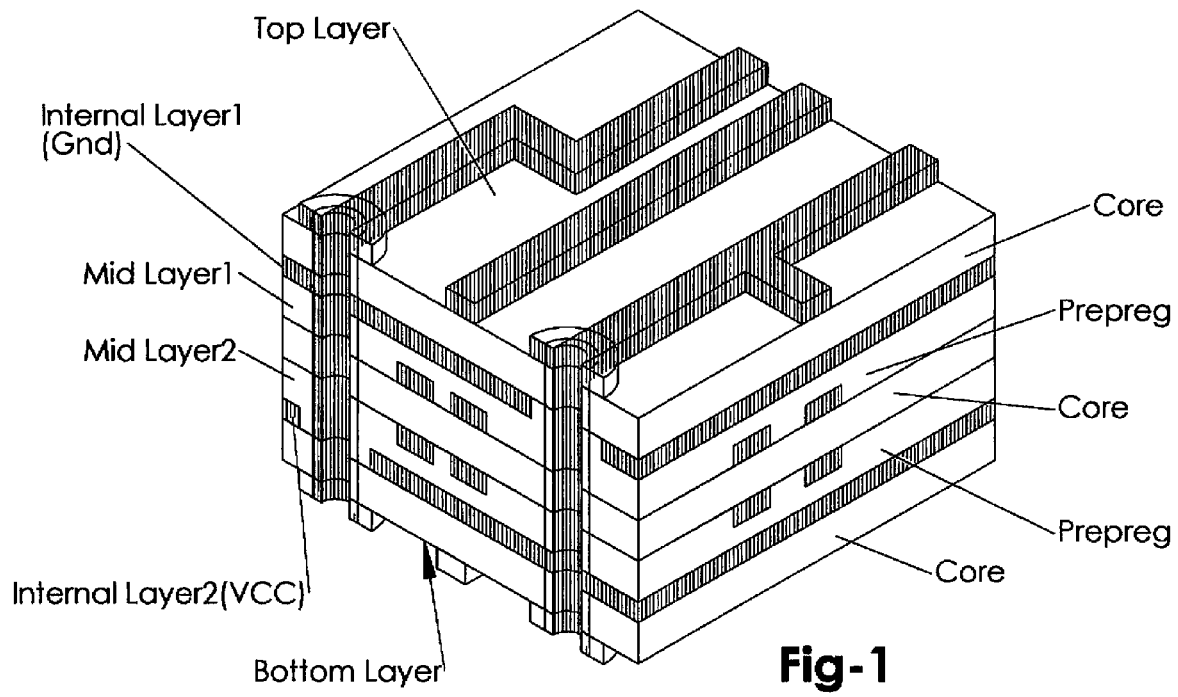
Fig-1
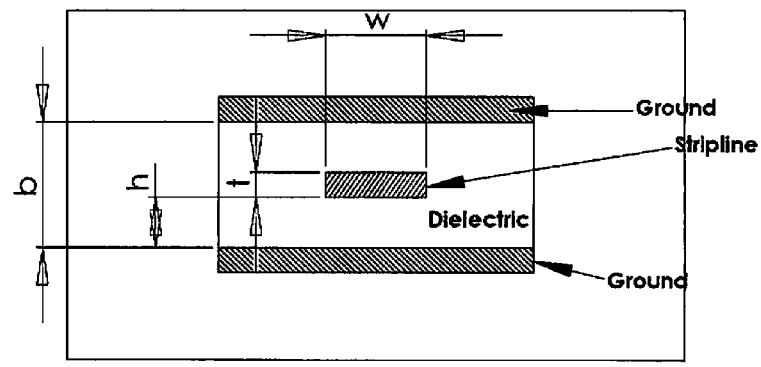
Fig-2
$$Z_0 = \frac{60}{\sqrt{E_r}} \ln\left[\frac{4H}{0.67\pi W(0.8 + t/D)}\right]$$
Fig-3

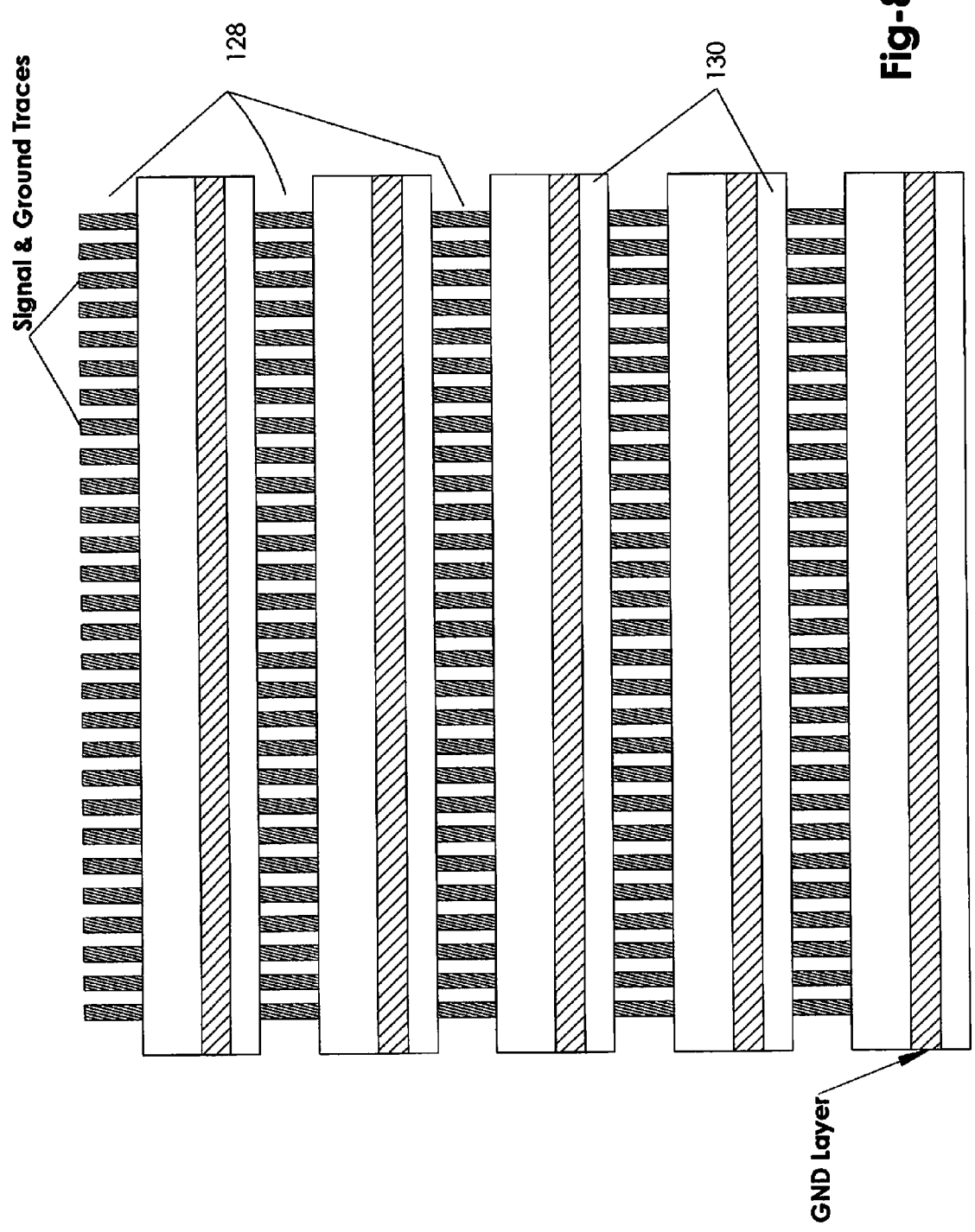

PROCESS FOR MAKING A MULTILAYER CIRCUIT BOARD

This application is related to and incorporates by reference in its entirety the invention disclosures of U.S. patent application Ser. No. 11/890,222, and U.S. Provisional Applications Ser. No. 61/001,156 filed on Oct. 31, 2007, and Ser. No. 60/989,361 filed Nov. 20, 2007. Applicants claim priority to U.S. Provisional Applications Ser. No. 61/001,156 filed on Oct. 31, 2007

FIELD OF THE INVENTION

The present invention relates generally multilayer circuit apparatus and more particularly to a process for making a multi-layered circuit board having closely spaced circuit traces and particularly suited for use as a multi-circuit interface/connector device or a probe card transformer used to link an IC test system to probe pins or contactors used to engage the die pads or solder bumps or the like of IC devices before they are separated from the wafer upon which they are formed.

BACKGROUND OF THE INVENTION

A probe card assembly typically includes a contactor substrate carrying a large number of die pad contacting pins, a space transformer for connecting the closely positioned pins to a set of terminals positioned outwardly from the pin positions, and an interface board that serves as a means for connecting the hundreds or thousands of connector terminals to corresponding power, ground and signal terminals of an Automatic Test Equipment (ATE).

The space transformer and the interface board are typically fabricated using well known printed circuit board (PCB) processes and materials. Such components are usually made by adhering a layer of copper over a substrate, sometimes on both sides, then removing unwanted copper (eg. by etching) after applying a temporary mask, leaving only the desired copper traces. A plurality of such boards are then laminated together and the traces formed thereon are interconnected to provide a means for connecting power and signals to a plurality of microminiature electronic devices. Some of these PCB assemblies are made by adding traces to a bare substrate (or a substrate with a very thin layer of copper) usually by a complex process of multiple electroplating steps or by using inkjet printing techniques.

Another application of multilayer circuit boards of the type to be described herein is to provide an improved package interface or external interface device that can be used to improve, augment or even replace the Ball Grid Array (BGA) which has heretofore provided a solution to the problem of packaging and interconnecting an integrated circuit with many hundreds of pins. As pin grid arrays and dual-in-line surface mount (SOIC) packages are produced with more and more pins, and with decreasing spacing between the pins, interfacing difficulties arise in connecting the integrated circuits to systems using the circuit device. For example, as even modern package pins get closer together, the danger of accidentally bridging adjacent pins with solder increases. BGAs have provided an element of solution to the problem in that they enable the solder to be factory-applied to the package in exactly the right amount. Moreover, the shorter an electrical conductor between IC device and the system to which it is connected, the lower its inductance, a property which causes unwanted distortion of signals in high-speed electronic circuits. BGAs, with their very short distance between the package and the PCB, have low inductances and therefore have far superior electrical performance to leaded devices. However, as IC devices continue to include more and more I/Os it is not always convenient to use the standard I/O locations of even BGA packages for connecting an electronic device to a system using the device. There is thus a need for an improved circuit board type of interface means for allowing freedom from connection constraints when high pin-out devices are to be connected to a user system.

There are basically three common "subtractive" methods (methods that remove copper) used in the production of printed circuit boards:

1) Silk screen printing, which uses etch-resistant inks to protect the copper foil, with subsequent etching used to remove the unwanted copper. Alternatively, the ink may be conductive and printed on a blank (non-conductive) board;

2) Photoengraving, which uses a photomask and chemical etching to remove the copper foil from the substrate. The photomask is usually prepared with a photoplotter from data produced by a technician using CAM (computer-aided manufacturing) software. Laser-printed transparencies are typically employed for phototools; however, direct laser imaging techniques are being employed to replace phototools for high-resolution requirements. However, state of the art laser technology can not be utilized to produce trace spacings of less than about 25 microns; and 3) PCB milling, which uses a two or three-axis mechanical milling system to mill away the copper foil from the substrate.

"Additive" processes may also be used. The most common is the "semi-additive" process in which an unpatterned board is provided with a thin layer of copper on its surface. A reverse mask is then applied that, unlike a subtractive process mask, exposes those parts of the substrate that will eventually become the traces. Additional copper is then plated onto the board in the unmasked areas. Tin-lead or other surface platings are then applied. The mask is stripped away and a brief etching step removes the now-exposed original copper laminate from the board, isolating the individual traces. The additive process is commonly used for multi-layer boards as it facilitates the plating-through of the holes (vias) in the circuit board. However, a problem with use of this method for small trace geometries is that the etching step undercuts the edges of the traces yielding undesirable results.

As circuit device geometries have continued to shrink and the number of circuit devices on each die has increased, the number of contact pads per die has also dramatically increased. This, coupled with a decrease in die size, has dramatically increased the pad density of IC devices produced on a processed wafer. Furthermore, with increases in wafer size and decreases in die size and contact pad pitch, the number of dies as well as the number of contact pads on a wafer has likewise increased.

Moreover, since production efficiencies require that all die now be tested at the wafer level, it is no longer feasible to test each die individually, and accordingly, it is important that many die be simultaneously tested. This of course means that thousands of electrically conductive lines must be routed between the probe pins used to contact the die pads (or solder bumps or the like) and a test equipment. In order to accomplish this task by making electrical contact with the die pads, it is necessary to provide thousands of conductive traces on or in the various devices used to link the contacting pins to the ATE. Thus, multilayer PCBs are used to provide the large number of circuit traces in the space available. Compactness of the traces also requires that the trace width and thickness be reduced, as well as the spacing between traces. A typical prior art multi-layer circuit board is shown in FIG. 1.

However, since signals carried by the signal traces are often at very high frequencies, the traces must be electrically isolated from each other in order to avoid cross talk between the traces and to control the impedance of the traces. Stripline technology is commonly used in making multilayer circuit boards.

A stripline is a conductor sandwiched by dielectric between a pair of groundplanes. In practice, a stripline is usually made by etching circuitry on a substrate that has a groundplane on the opposite face, then adding a second substrate (which is metalized on only one surface) on top to achieve the second groundplane. Stripline is most often a "soft-board" technology, but using low-temperature co-fired ceramics (LTCC), ceramic stripline circuits is also possible.

All kinds of circuits can be fabricated if a third layer of dielectric is added along with a second interior metal layer, for example, a stack-up of 31 mil Duroid, then 5 mil Duroid, then 31 mil Duroid (Duroid is a trademark of the Rogers Corporation). Transmission lines on either of the interior metal layers behave very nearly like "classic" stripline, the slight asymmetry is not a problem. For example, excellent "broadside" couplers can be made by running transmission lines parallel to each other on the two surfaces. Other variants of the stripline are offset strip line and suspended air stripline (SAS).

For stripline and offset stripline, because all of the fields are constrained to the same dielectric, the effective dielectric constant is equal to the relative dielectric constant of the chosen dielectric material.

Stripline is a TEM (transverse electromagnetic) transmission line media, like coax. This means that it is non-dispersive, and has no cutoff frequency. Stripline filters and couplers always offer better bandwidth than their counterparts in microstrip.

Another advantage of stripline is that excellent isolation between adjacent traces can be achieved (as opposed to microstrip). Very good isolation results when a picket-fence of vias surrounds each transmission line, spaced at less than ¼ wavelength. Stripline can also be used to route RF signals across each other quite easily when offset stripline is used.

Disadvantages of stripline are two: first, it is much harder (and more expensive) to fabricate than microstrip. Lumped-element and active components either have to be buried between the groundplanes (generally a tricky proposition), or transitions to microstrip must be employed as needed to make connections on the top of the board.

A second disadvantage of stripline is that because of the second groundplane, the strip widths are much narrower for a given impedance (such as 50 ohms) and board thickness than for microstrip. This disadvantage is however a benefit as will be described below in the description of the present invention.

A simplified equation for the line impedance of stripline is given as:

$$Z_0 = \frac{60}{\sqrt{\varepsilon_r}} \ln\left[\frac{4H}{0.67\pi W\left(0.8 + \frac{t}{D}\right)}\right]$$

where the variables are illustrated in FIG. 2 of the drawing.

An objective of the present invention is thus to provide a novel method of producing a multilayer printed circuit board with electrically isolated traces having widths and spacings suitable for the application described above.

In the attached drawings:

FIG. 1 is an illustration of a prior art multilayer printed circuit board;

FIG. 2 is a diagram illustrating a stripline;

FIG. 3 is a simplified stripline equation relating to the diagram of FIG. 2;

FIG. 8 shows an assembly including a plurality of layers of circuit boards of the type depicted in FIG. 7f;

DETAILED DESCRIPTION OF EMBODIMENTS

Figure 4A:
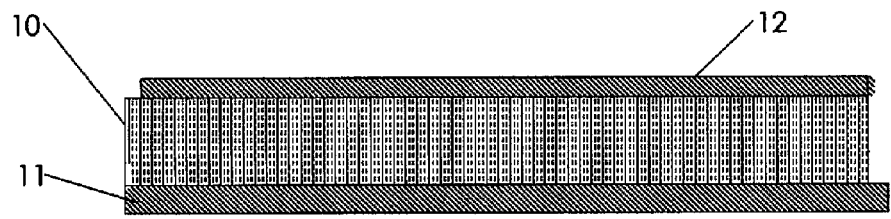
FIGS. 4a-4f illustrate an embodiment of a process for making circuit boards having parallel circuit traces with extremely narrow spacings therebetween in accordance with the present invention.

Referring now to FIG. 4a, a planar substrate is shown generally at 10 having a particular dielectric constant suitable for the application described. Board 10 may be of a ceramic material, a woven epoxy glass material known as FR4, or any other suitable substrate material. The substrate board may have a metal layer of a material such as copper plated on its bottom surface as indicated at 11

In accordance with a first embodiment of the present invention wherein circuit traces are to be provided by electroplating, a first step is to lay down a thin metallic seed layer 12 of a suitable material, such as copper or silver for example, on the upper surface of the substrate by printing, spraying, using an electroless process, etc. The seed layer 12 is a very thin plating of about 1 micron thickness with high conductive quality and good adherence to the substrate 10. This layer will serve as a foundation for the subsequent plating process.

Figure 4B:
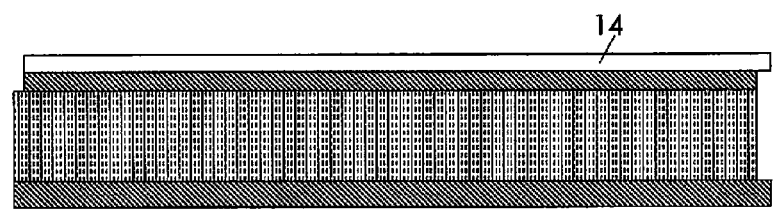
Figure 4C:
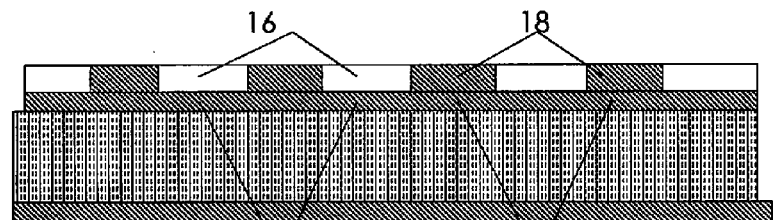

The next step, as illustrated in FIG. 4b, is to cover the surface of the seed layer 12 with a layer 14 of photoresist, and to use well known mask and exposure techniques to delineate, as suggested in FIG. 4c, a circuit trace pattern in the resist having spacings 16 between the defined areas 18 in which conductive seed traces 17b (shown in transverse cross-section) will be formed. In accordance with the present invention, the spacings 16 can be less than 25 microns in width and the trace widths can likewise be less than 25 microns. The pattern is then developed by application of a stripper to remove the resist in the areas 16 and to uncover the seed layer 17a lying therebeneath.

Figure 4D:
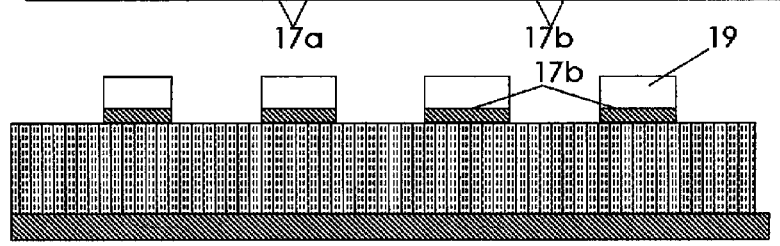

An etching operation is then used to remove the exposed areas 17a of the seed layer leaving only the seed traces 17b as depicted in FIG. 4d.

Figure 4E:
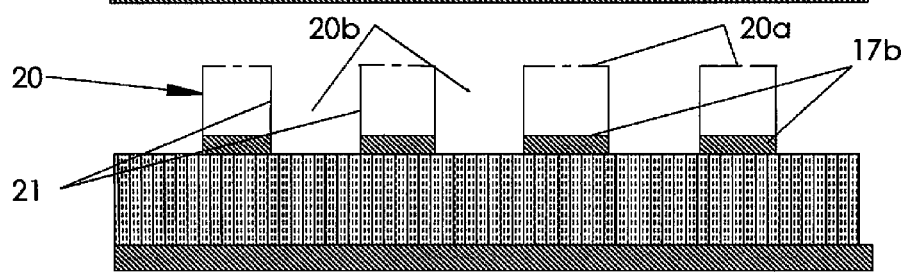

The next step is to strip the resist 19 from the top surfaces of the seed layer traces 17b and to again use a photolithographic process and an opposite type of photoresist to develop a thick layer (preferably between about 50 and 200 microns in thickness) of photoresist 20 which can be subjected to a photolithographic process to uncover the seed traces 17b but leave relatively high (approximately 50-200 microns in height) ribs of resist 20a forming open channels or valleys 20b lying directly above the seed traces 17b, the valleys being defined by the vertical, well defined rib walls 21. The relatively high ribs 20 thus rise above the edge boundaries of the seed layer traces 17b as shown in FIG. 4e. In accordance with this embodiment, the height of the ribs 20a will be at least twice the width of the seed trace 17b but may be substantially greater.

Figure 4F:
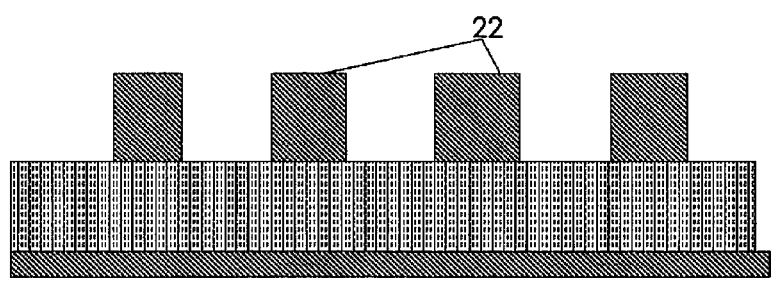

A predetermined thickness of conductive metal can then be electroplated to a predetermined height onto the seed layer traces 17b between the photoresist ribs or barriers 20a, and a suitable stripper can then be used to strip away the ribs 20a to leave well defined conductive traces 22 as depicted in FIG. 4f. It will thus be appreciated that in using the method described above and illustrated in FIGS. 4a-4f, conductive traces having predetermined cross-sectional area and separated by spaces of less than 25 microns can be provided. Note that the cross-sectional area of the traces can be of any desired width and height required to accommodate a particular level of current flow.

Currently, a desirable trace spacing is less than 20 microns. However, for a variety of reasons, no prior art process is capable at this time of producing well defined circuit traces having trace widths of 25 microns or less separated by less than about 25 microns and capable of handling sufficient electrical current to be useful in multilayer circuit card assemblies such as the transformer devices used in probe card systems.

Figure 5:
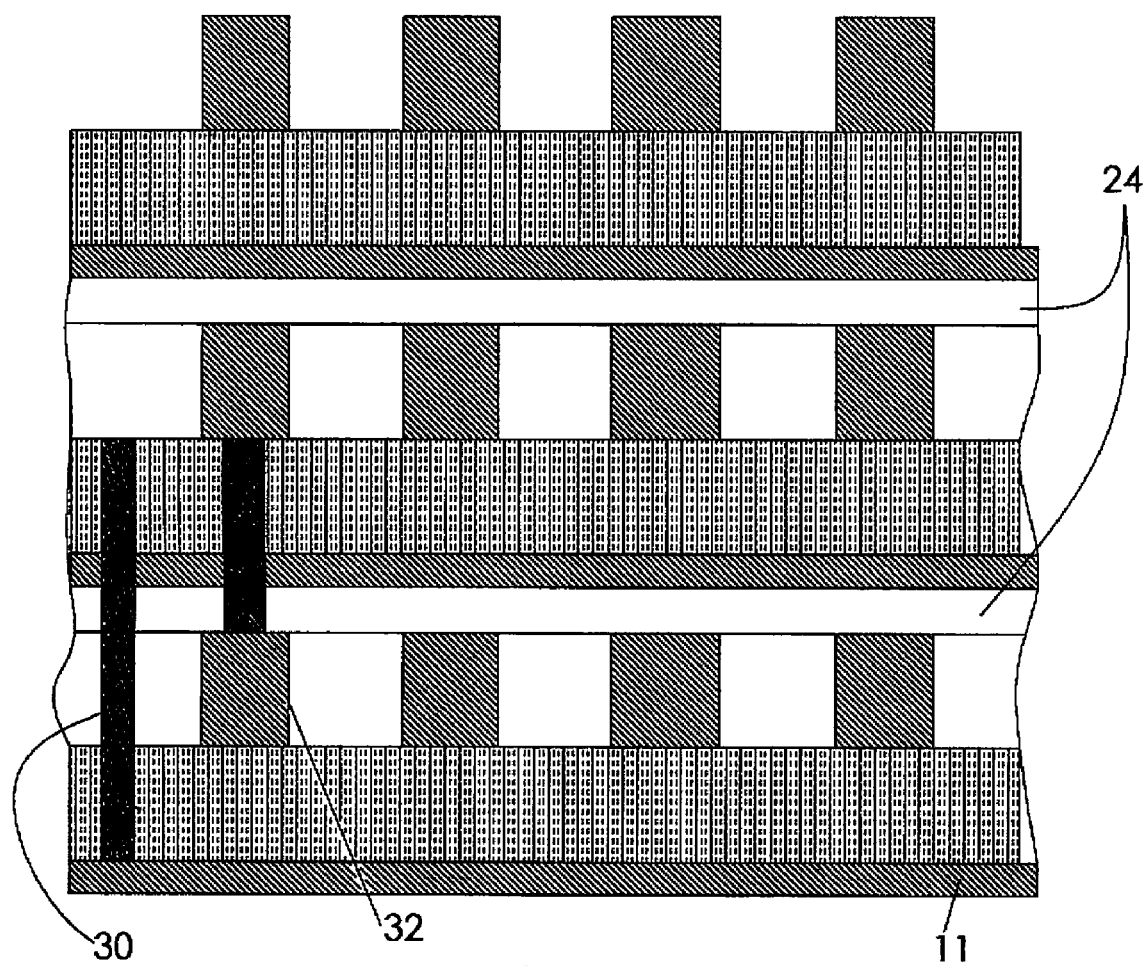
FIG. 5 is a simplified cross section illustrating an embodiment of a multilayered circuit board made in accordance with the present invention.

Once several boards are produced they can be drilled to accommodate interconnections through vias (as shown at 30 and 32 in FIG. 5), and be stacked and joined together by layers 24 of insulative bonding material such as Prepreg, Bondply, or the like. Note that in some cases two or more of the boards may be joined together and then drilled to provide for connecting vias.

Figure 6:
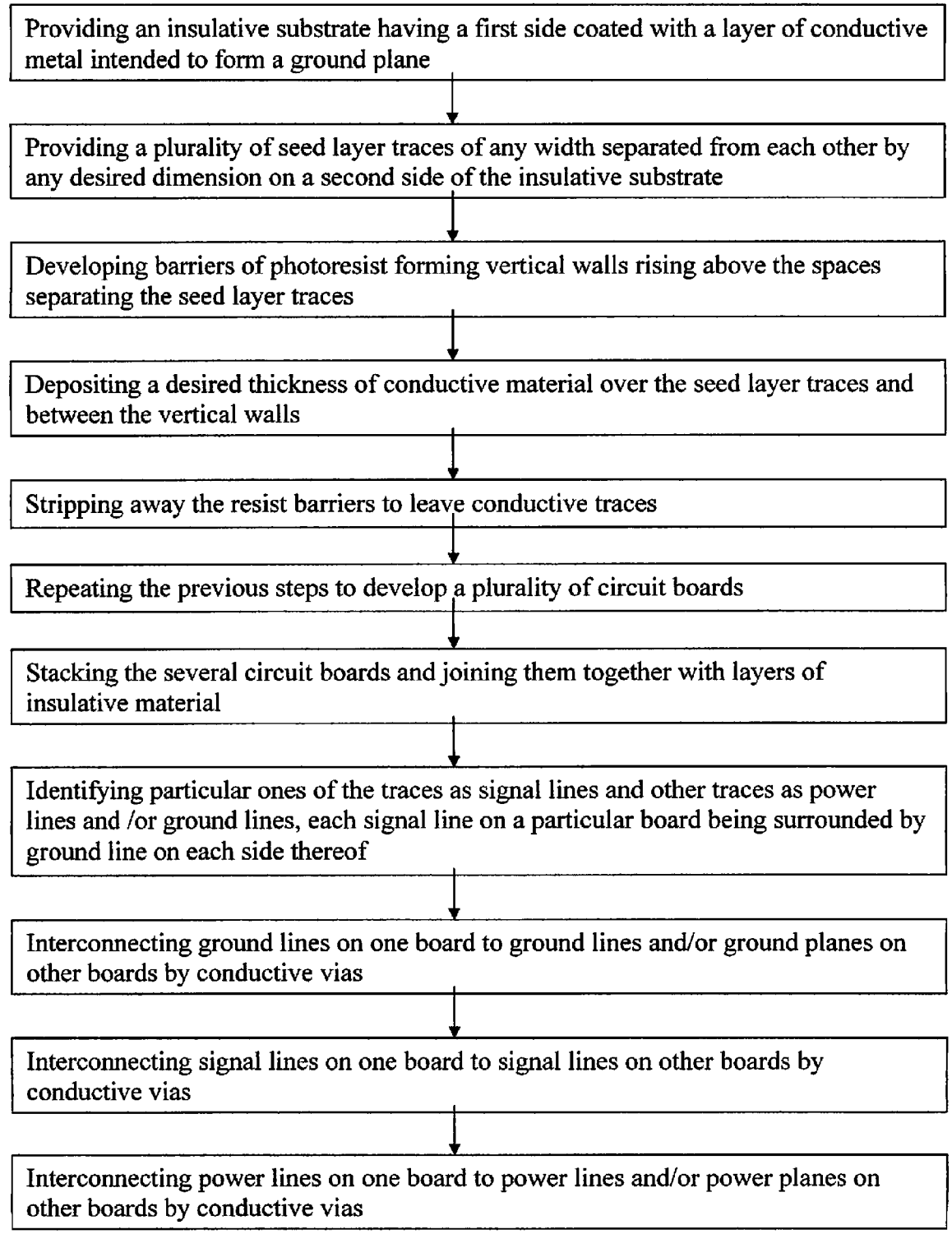
FIG. 6 is a flow diagram illustrating generally the principal steps of an embodiment of the method illustrated in FIG. 4a-4f.

Basically, as illustrated by the flow diagram of FIG. 6, the method or process of one embodiment of the present invention may be stated generally as follows:

1) Providing a first insulative substrate having one or more surface areas on a first side coated with a layer of conductive metal intended to form one or more ground plane conductors;

2) Providing on a second side of said substrate a plurality of elongated seed layer traces having at least substantial portions thereof with a predetermined width of approximately 25 microns or less, adjacent ones of said seed layer traces being separated from each other by a predetermined distance of approximately 25 microns or less, the narrowness of such separation being essentially limited only by the characteristics of the photoresist material to be deposited and developed therebetween and its ability to withstand subsequent processing;

3) Photolithographically developing ribs or barriers of photoresist rising above the spaces separating the seed layer traces and having vertical side walls defining valleys or channels over the seed layer traces, the side walls having a height dimension substantially exceeding the width of a seed layer trace;

4) Depositing conductive material over the seed layer traces and in the valleys or channels between the vertical walls to a thickness (depth) substantially greater than the width of the channels and underlying seed layer traces;

5) Stripping away the resist ribs or barriers to leave conductive traces to be variously used as ground lines, signal lines and/or power lines of a circuit board;

6) Repeating the previous steps to develop a plurality of other circuit boards;

7) Stacking the several circuit boards and joining them together with layers of insulative material disposed therebetween;

8) Identifying particular ones of the conductive traces on various ones of the circuit boards as signal lines and other conductive traces as power lines and/or ground lines;

9) Interconnecting at least some of the ground lines on one board to ground lines and/or ground planes on other boards by conductors extending through vias;

10) Interconnecting conductive traces identified on one of the circuit boards as signal lines to signal input and output terminals, and perhaps to other conductive traces identified as signal lines on other boards through vias; and 11) Interconnecting conductive traces identified on various ones of the circuit boards as power lines to power input and output terminals, and/or perhaps to conductive traces identified as power lines on other circuit boards through vias.

In an alternative embodiment, at least some of the signal lines may be separated by a ground line.

In another alternative embodiment, substantially all of the signal lines on at least one of the circuit boards may be separated by ground lines.

In yet another alternative embodiment, a probe card device may be made by connecting contactor pins to at least some of the ground lines, the output terminals of at least some of the power lines and the output terminals of at least some of the signal lines.

In FIGS. 7a-9, an alternative embodiment of the present invention is disclosed wherein instead of using an electroplating process to generate the conductive traces, an ink jet printing device, or the like, is used to deposit conductive material in fluid form into the trace defining channels or valleys provided in a manner similar to that described above. In this embodiment, seed traces are not depicted because they are not believed to be necessary. However, such traces could be used in some circumstances to enhance the filling of the channels with conductive liquid.

Figure 7A:
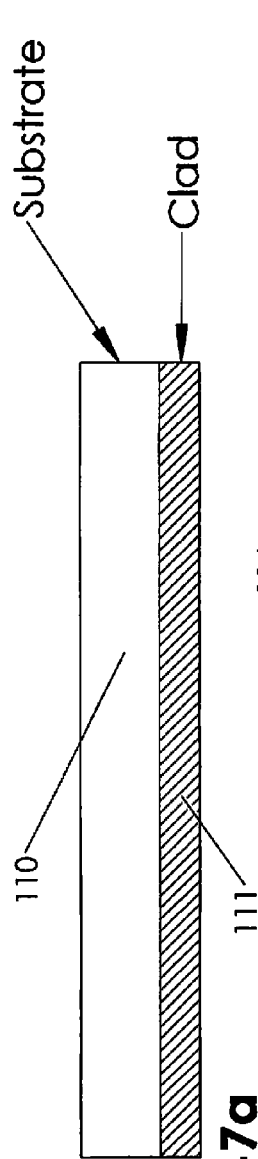
FIGS. 7a-7f illustrate an alternative embodiment of a process for making circuit boards having parallel circuit traces with extremely narrow spacings therebetween in accordance with the present invention.

Referring now to FIG. 7a, in forming a circuit board in accordance with the present invention, a planar starting substrate is shown generally at 110 having a particular dielectric constant suitable for the application described. Board 110 may be of a ceramic material, which is either a fired ceramic or an unfinished cold-fire ceramic, a woven epoxy glass material such as that known as FR4, or any other suitable substrate material. The board preferably, but not necessarily, has a thin layer of metal, such as copper, plated on its bottom surface, as indicated at 111, to form a ground plane. Such ground plane need not be unitary or pre-attached to the substrate and as is well known in the art can be added as a separate layer covering one or more areas of the lower substrate surface during assembly of a device in accordance with the present invention.

Figure 7B:
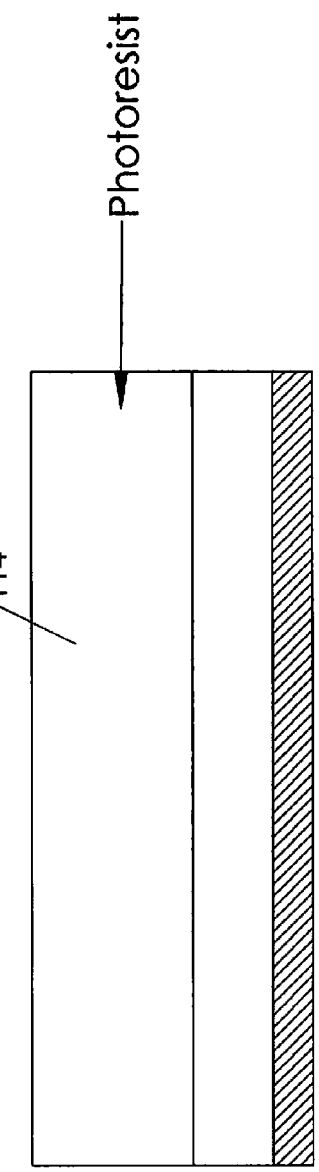
Figure 7C:
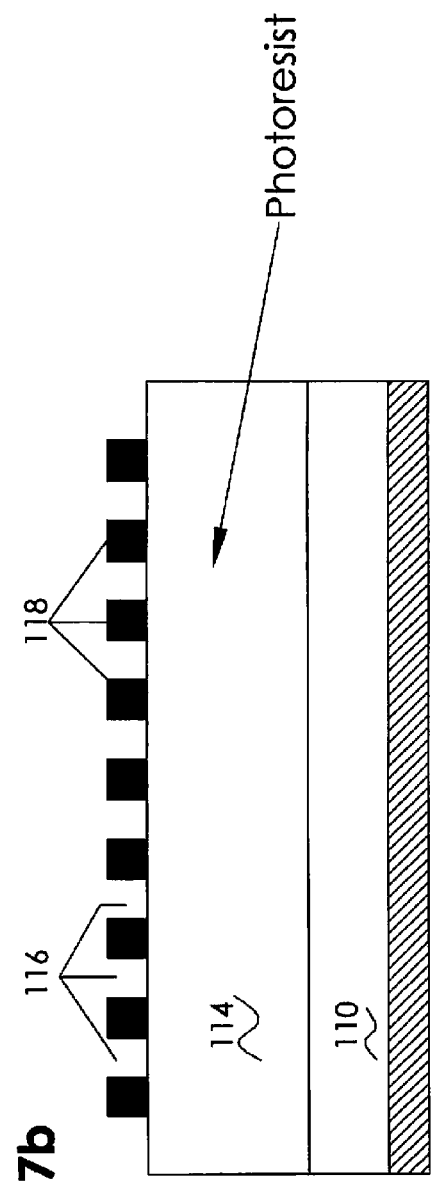
Figure 7D:
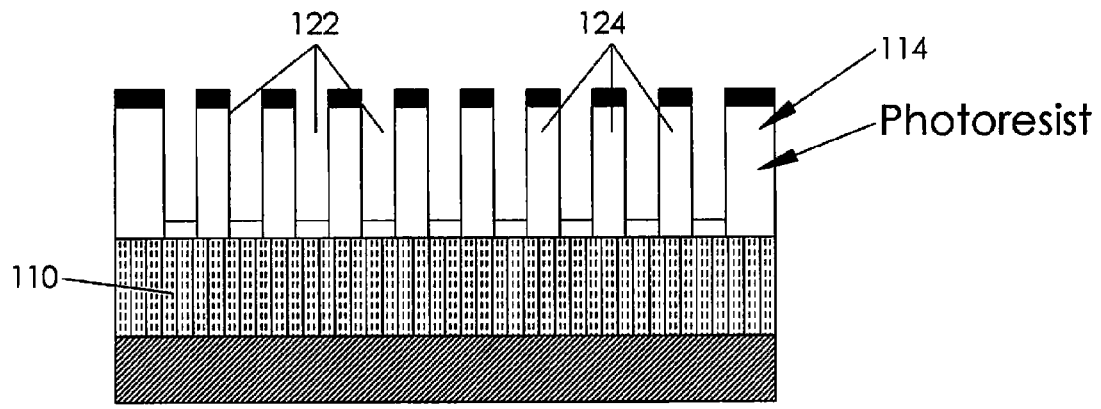

In this embodiment wherein circuit traces are to be provided using an inkjet printing apparatus such as that manufactured by Imaging Technology International of Cambridge, England, using a nano-silver ink such as that sold by Advanced Nano Products., Ltd. Of Korea, no metallic seed layer is required. Accordingly, the first step, as illustrated in FIG. 7b, is to cover the surface of the layer 110 with a thick layer 114 of photoresist (typically between 50 microns and 200 microns in thickness), and to use well known masking techniques, as suggested in FIG. 7c, to delineate a mask pattern above the resist having spaces or openings 116 between masked areas 118. The open areas 116 will allow photolithographic removal of the photoresist lying directly therebeneath to define channels or valleys 122 (as shown in transverse cross-section in FIG. 7d) separated and defined by ribs or barriers 124 of resist remaining beneath the masked areas. In accordance with the present invention, the transverse width of the channels 122 can be less than 25 microns and the widths of the ribs of resist 124 can likewise be less than 25 microns. And because of the thickness of the photoresist 114, the depth of the channels 122 can be as much as 50 to 200 microns or more.

Figure 7E:
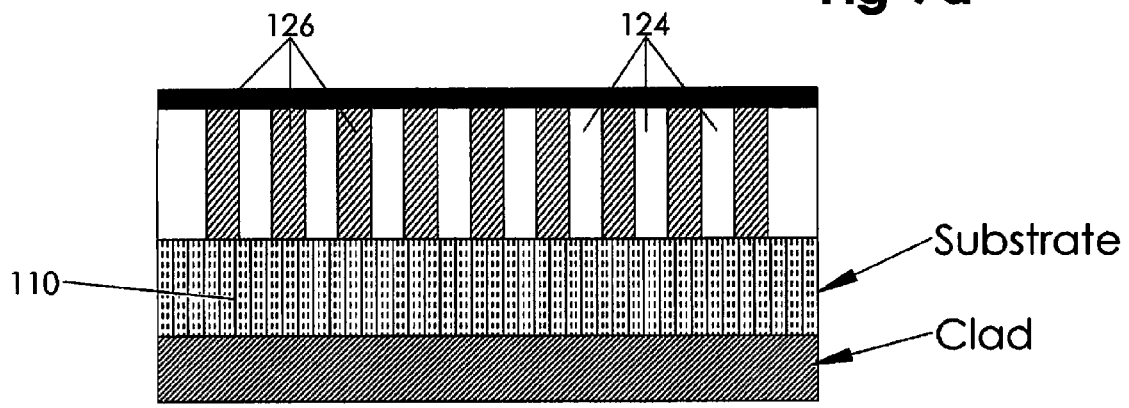
Figure 7F:
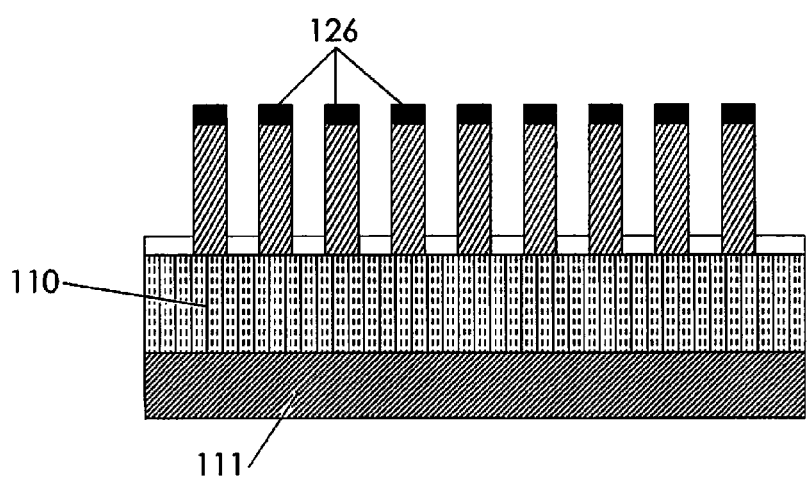

A predetermined thickness of a liquid metal can then be "printed" or deposited into the channels 122 between the photoresist ribs or barriers 124, as shown in FIG. 7e, and after a suitable heat treatment to solidify the liquid metal traces 126, a suitable stripper can be used to strip away the ribs 124 to leave a circuit layer of well defined conductive traces 126 as depicted in FIG. 7f. It will thus be appreciated that in using the method described above and illustrated in FIGS. 7a-7e, a circuit layer of conductive traces can be formed on a dielectric substrate with the traces having predetermined cross-sectional area and being separated by less than 25 microns. Note that the cross-sectional area of the traces can be of any desired width and height dimensions as required to satisfy a particular design criteria.

Currently, a desirable trace spacing is less than 20 microns. However, as pointed out above, no prior art printed circuit board making process is capable at this time of producing well defined circuit traces having trace widths of 25 microns or less separated by less than about 25 microns and capable of handling sufficient electrical current to be useful in multilayer circuit devices such as the transformer devices used in probe card systems.

Figure 9:
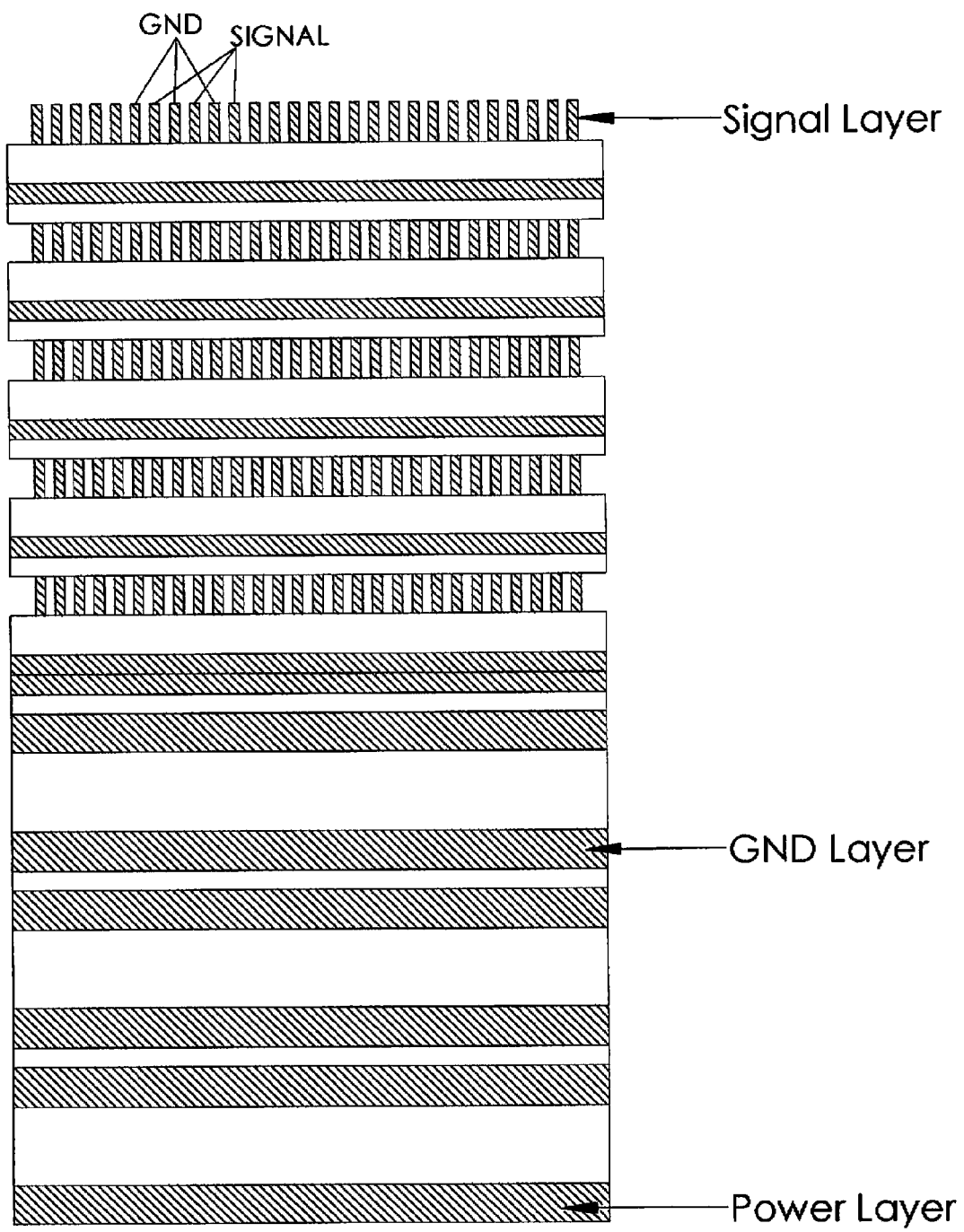
FIG. 9 shows a cross section of a circuit board assembly including the assembly depicted in FIG. 8 and further including separate power and ground layers.

Once several circuit board layers or components are produced, they can be drilled to accommodate interconnecting vias (not shown), stacked and joined together as depicted in FIGS. 8 and 9, by layers 130 of insulative bonding material such as Prepreg, Bondply, or layers of ceramic, or other dielectric material and epoxy or other suitable adhesive material. Alternatively, vias can be drilled or laser-formed after one or more of the circuit board layers or components are joined together.

Figure 10:
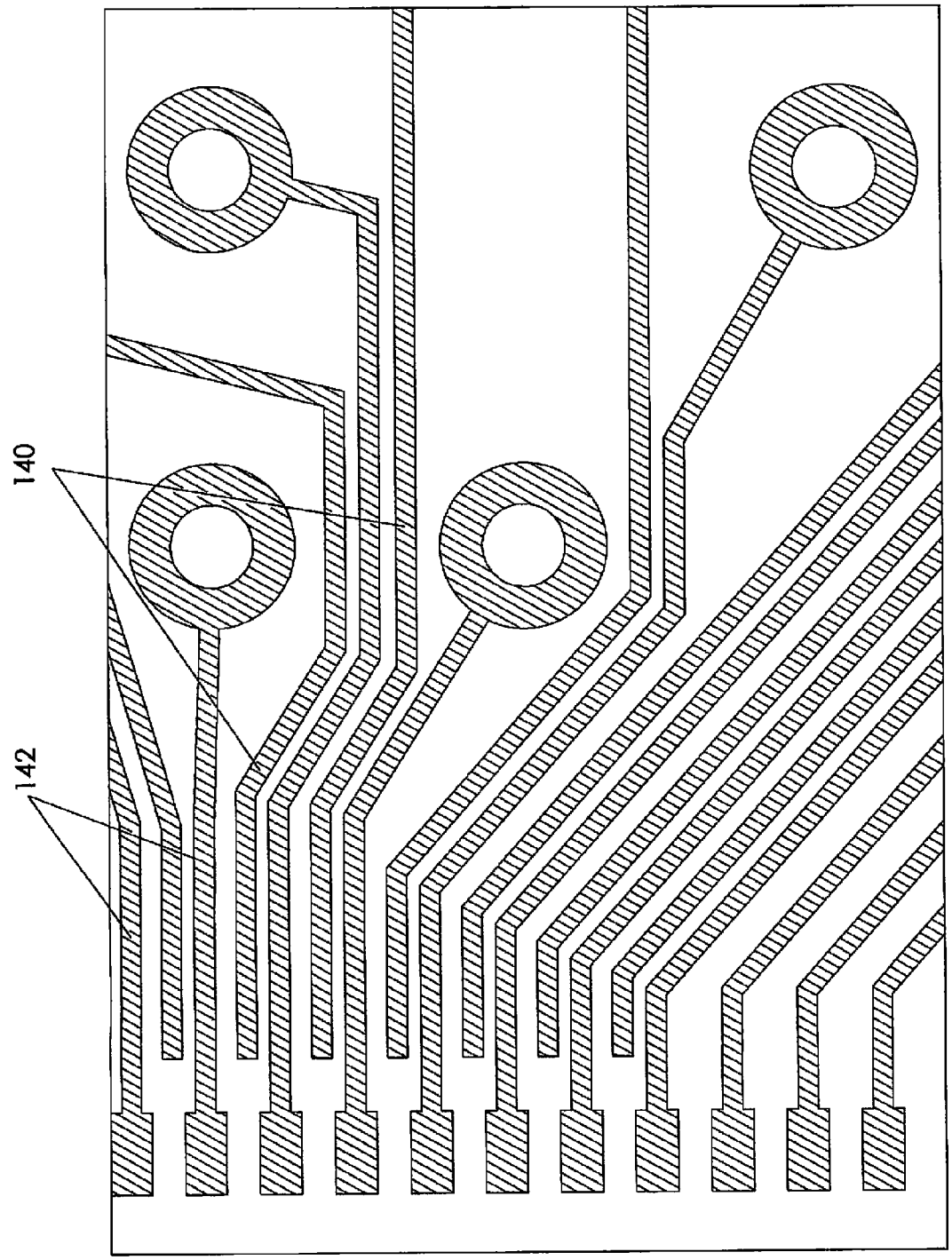
FIG. 10 shows a partial plan view of a circuit of the type formed in accordance with the present invention.
Figure 11:
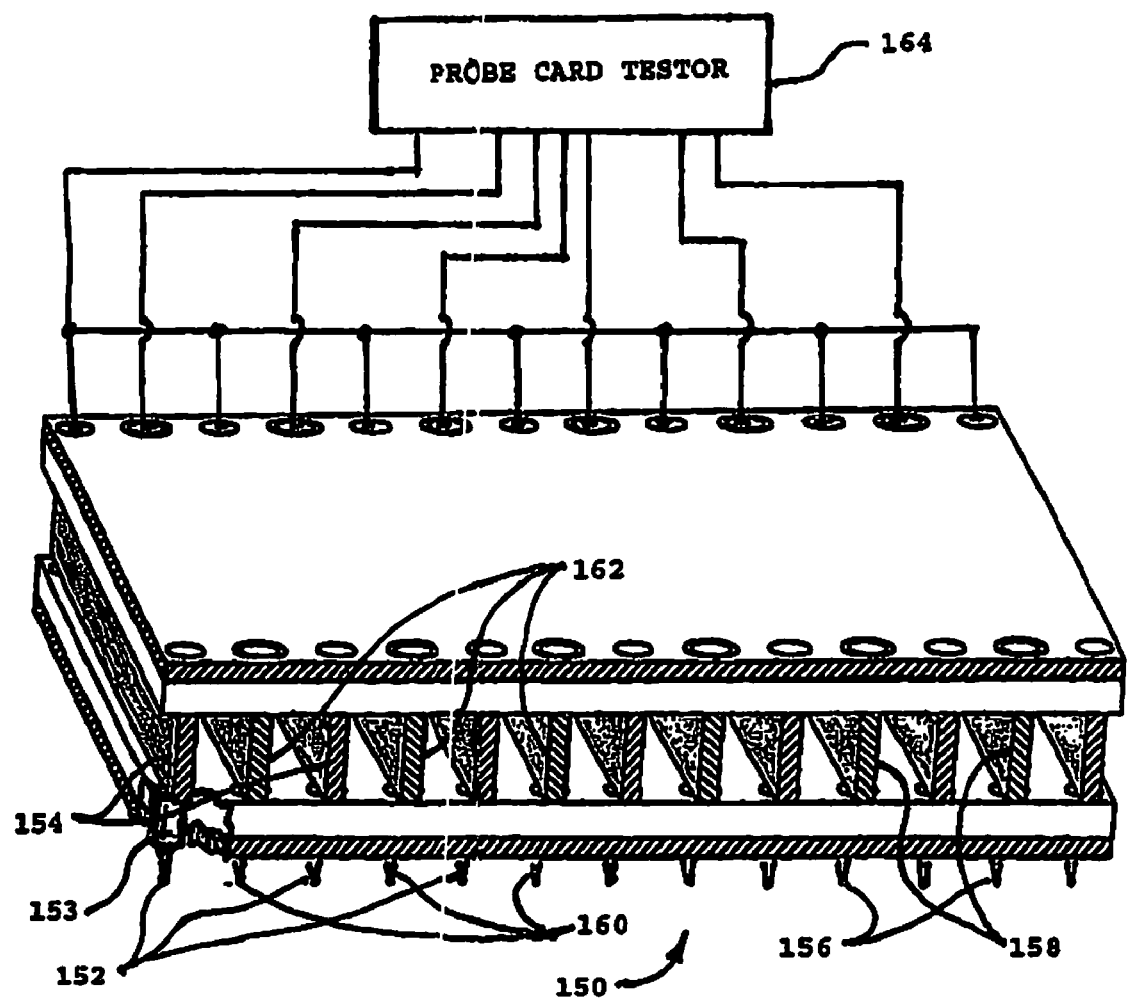
FIG. 11 is a simplified illustration of a probe card made using a circuit board of the type shown above.

A portion of an exemplary circuit layer is illustrated in FIG. 10 and includes signal traces 140 separated by ground lines 142.

This embodiment of the present invention may be stated generally as follows:

1) Providing an insulative substrate;
2) Developing ribs or barriers of photoresist forming circuit trace defining channels having vertical walls rising above the substrate surface upon which the circuit traces will be formed;
3) Depositing a desired thickness of liquid conductive material into the channels formed between the vertical walls;
4) Curing the deposited material and stripping away the resist ribs or barriers to leave conductive traces to be variously used as ground lines, signal lines and/or power lines;
5) Repeating the previous steps to develop a plurality of circuit boards;
6) Stacking the several circuit boards and joining them together with layers of insulative material;
7) Identifying particular ones of the traces as signal lines and other traces as power lines and/or ground lines;
8) Interconnecting the ground lines on one board to ground lines and/or ground planes on other boards by conductors extending through vias;
9) Interconnecting signal lines to signal input and output terminals; and
10) Interconnecting the power lines to power input and output terminals, and perhaps to power lines on other boards through vias.

In an alternative embodiment, at least some of the signal lines may be separated by a ground line.

In another alternative embodiment, substantially all of the signal lines may be separated by a ground line.

In yet another alternative embodiment, and as suggested in the simplied embodiment depicted in FIG. 10, a probe card device 150 or the like including one or more multilayer circuit boards of the type described above may be made by connecting contactor pins or other connecting devices 152 (through lower layer vias 153) to the proximal ends of at least some of the ground line traces 154, by connecting contactor pins 156 to the proximal ends of power line traces 158, and/or by connecting contactor pins 160 to the proximal ends of some of signal line traces 162. An appropriate test apparatus 164 or other functional device connected to the opposite ends of the densely packed circuit traces through via conductors can then communicate with the pins substantially free of signal crosstalk and perform tests on wafers engaged by the several contactor pins.

The invention claimed is:

1. A process for making a multilayer circuit board device having electrically isolated tightly spaced electrical current carrying traces, comprising:
   providing a substrate made of a first layer of electrical insulating material having a first layer of conductive material affixed to one side thereof to form a ground plane;
   providing a plurality of elongated metallic first seed layer traces on a second side of the substrate, said seed layer traces having transverse widths of approximately 25 microns or less with adjacent traces being separated from each other by first elongated spaces;
   developing within said first elongated spaces upstanding first ribs of photoresist forming first vertical walls rising above the upper surface of adjacent seed layer traces to a height greater than 25 microns, said first walls defining open first channels above said first seed layer traces;
   depositing a first conductive signal trace material having a thickness exceeding 25 microns in height into said channels and over said seed layer traces; and
   stripping away said ribs to leave a plurality of elongated first conductive traces having a height-to-transverse-width ratio exceeding 1, said first conductive traces being variously useful as ground lines, signal lines and/or power lines.

2. A process for making a multilayer circuit board device as recited in claim 1 wherein said first elongated spaces have transverse widths of approximately 25 microns or less.

3. A process for making a multilayer circuit board device as recited in claim 1 and further comprising:
   providing a second layer of electrical insulating material over said first conductive traces; and
   providing a second layer of conductive material over said second layer of electrical insulating material.

4. A process for making a multilayer circuit board device as recited in claim 3 and further comprising: providing a third layer of electrical insulating material over said second layer of conductive material;
   providing a plurality of elongated metallic second seed layer traces on said third layer of electrical insulating material, said second seed layer traces having transverse widths of approximately 25 microns or less with adjacent traces being separated from each other by second elongated spaces;

developing within said second spaces upstanding second ribs of photoresist forming second vertical walls rising above the upper surface of adjacent second seed layer traces to a height greater than 25 microns, said second walls defining second open channels above said second seed layer traces;

depositing a thickness of second conductive material exceeding 25 microns in height into said second channels and over said second seed layer traces; and stripping away said second ribs to leave a plurality of elongated second conductive traces having a height-to-transverse-width ratio exceeding 1, said traces being variously useful as ground lines, signal lines and/or power lines.

5. A process for making a multilayer circuit board device as recited in claim 4 wherein at least some of said first and second elongated spaces have transverse widths of approximately 25 microns or less.

6. A process for making a multilayer circuit board device as recited in claim 4 wherein at least some of said first conductive traces are electrically connected to some of said second conductive traces through vias extending through said second layer of electrical insulating material, said second layer of conductive material and said third layer of electrical insulating material.

7. A process for making a multilayer circuit board device having electrically isolated tightly spaced electrical current carrying traces, comprising:

providing a substrate made of a first layer of electrical insulating material having a first conductive material affixed to one side thereof to form a ground plane;

forming on said first layer of electrical insulating material a plurality of upstanding first ribs of photoresist having first vertical walls rising above the upper surface of said first layer of electrical insulating material to a height greater than 25 microns, said first walls defining open first channels on the upper surface of said first layer of electrical insulating material;

depositing a first trace forming material having a thickness exceeding 25 microns in height into said channels; and stripping away said ribs to leave a plurality of elongated first conductive traces separated by first elongated spaces and having a height-to-transverse-width ratio exceeding 1, said first conductive traces being variously useful as ground lines, signal lines and/or power lines.

8. A process for making a multilayer circuit board device as recited in claim 7 wherein said first elongated spaces have transverse widths of approximately 25 microns or less.

9. A process for making a multilayer circuit board device as recited in claim 7 and further comprising:

providing a second layer of electrical insulating material over said first conductive traces; and providing a second conductive material over said second layer of electrical insulating material.

10. A process for making a multilayer circuit board device as recited in claim 9 and further comprising:

providing a third layer of electrical insulating material over said second conductive material;

forming on said third layer of electrical insulating material a plurality of upstanding second ribs of photoresist forming second vertical walls rising above the upper surface of said third layer of electrical insulating material to a height greater than 25 microns, said second walls defining open second channels on the upper surface of said first layer of electrical insulating material;

depositing a second trace forming material having a thickness exceeding 25 microns in height into said channels; and stripping away said second ribs to leave a plurality of elongated second conductive traces separated by second elongated spaces and having a height-to-transverse-width ratio exceeding 1, said second traces being variously useful as ground lines, signal lines and/or power lines.

11. A process for making a multilayer circuit board device as recited in claim 10 wherein at least some of said first and second elongated spaces have transverse widths of approximately 25 microns or less.

12. A process for making a multilayer circuit board device as recited in claim 10 wherein at least some of said first conductive traces are electrically connected to some of said second conductive traces through vias extending through at least one of said second layer of electrical insulating material, said second conductive material and said third layer of electrical insulating material.

* * * * *